(12) United States Patent
Wiater

(10) Patent No.: US 10,962,622 B2
(45) Date of Patent: Mar. 30, 2021

(54) ANALOG PROCESS VARIABLE TRANSMITTER WITH ELECTRONIC CALIBRATION

(71) Applicant: Rosemount Inc., Chanhassen, MN (US)

(72) Inventor: Nathan Len Wiater, Victoria, MN (US)

(73) Assignee: ROSEMOUNT INC., Chanhassen, MN (US)

(*) Notice: Subject to any disclaimer, the term of this patent is extended or adjusted under 35 U.S.C. 154(b) by 0 days.

(21) Appl. No.: 14/138,684

(22) Filed: Dec. 23, 2013

(65) Prior Publication Data

US 2015/0177356 A1    Jun. 25, 2015

(51) Int. Cl.
*G01R 35/00* (2006.01)
*G05B 19/042* (2006.01)
(Continued)

(52) U.S. Cl.
CPC .......... *G01R 35/005* (2013.01); *G01D 18/00* (2013.01); *G01R 1/203* (2013.01);
(Continued)

(58) Field of Classification Search
CPC ................ G05B 11/01; G05B 19/0423; G05B 19/4142; G05B 6/05; G01R 35/005;
(Continued)

(56) References Cited

U.S. PATENT DOCUMENTS

| 4,494,399 A | * | 1/1985 | Youngman | ............. G01D 18/00 204/406 |
| 4,704,607 A | * | 11/1987 | Teather | .............. G01N 33/0006 340/12.54 |

(Continued)

FOREIGN PATENT DOCUMENTS

| CN | 101166259 | 4/2008 |
| CN | 102841992 | 12/2012 |

(Continued)

OTHER PUBLICATIONS

Notification of Transmittal of the International Search Report and the Written Opinion of the International Searching Authority, PCT/US2014/055562, dated Jun. 15, 2015.

(Continued)

*Primary Examiner* — Lee E Rodak
*Assistant Examiner* — Brent J Andrews
(74) *Attorney, Agent, or Firm* — Westman, Champlin & Koehler, P.A.

(57) ABSTRACT

A process variable transmitter for measuring a process variable includes a process variable sensor configured to sense a process variable and provide a sensor output. Measurement circuitry receives the sensor output and provides a measured output related to the process variable. Output circuitry provides a device output on a two-wire process control loop based upon the measured output. The output circuitry has a transfer function that is a function of an adjustable analog circuit component. A motorized actuator is configured to adjust the adjustable analog circuit component to thereby change the transfer function of the output circuitry. An optional calibration controller is also provided.

18 Claims, 4 Drawing Sheets

(51) Int. Cl.
*G01D 18/00* (2006.01)
*G01R 1/20* (2006.01)

(52) U.S. Cl.
CPC ............ *G05B 19/0423* (2013.01); *G05B 2219/21127* (2013.01); *G05B 2219/23374* (2013.01)

(58) Field of Classification Search
CPC ...... G01R 1/203; G01R 119/12; G01R 35/00; G01D 18/00; G01D 3/021; G01G 23/01; G01G 7/06; F16K 37/0091; F16K 37/0083; G01L 9/12; H01H 36/006
USPC .......................................................... 324/98
See application file for complete search history.

(56) References Cited

U.S. PATENT DOCUMENTS

| | | | | |
|---|---|---|---|---|
| 4,748,852 | A * | 6/1988 | Frick | G01D 3/021 73/718 |
| 4,783,659 | A | 11/1988 | Frick | |
| 4,897,884 | A * | 1/1990 | Heller | G01D 18/00 340/870.04 |
| 5,187,474 | A | 2/1993 | Kielb et al. | |
| 5,253,511 | A | 10/1993 | Jaramillo et al. | |
| 5,278,543 | A * | 1/1994 | Orth | H01H 36/0006 340/870.16 |
| 5,431,182 | A * | 7/1995 | Brown | G05B 6/05 137/487.5 |
| 5,606,513 | A * | 2/1997 | Louwagie | G01F 1/363 702/138 |
| 7,525,419 | B2 | 4/2009 | Orth et al. | |
| 8,844,049 | B2 | 9/2014 | Wichmann et al. | |
| 2004/0113635 | A1 * | 6/2004 | Masuda et al. | 324/672 |
| 2005/0066175 | A1 | 3/2005 | Perlman | |
| 2006/0112773 | A1 * | 6/2006 | Hedtke | G05D 7/0635 73/861.61 |
| 2008/0019527 | A1 | 1/2008 | Youn et al. | |
| 2008/0291009 | A1 * | 11/2008 | Nelson et al. | 340/539.3 |
| 2010/0190422 | A1 | 7/2010 | Mann, Jr. et al. | |
| 2011/0057707 | A1 * | 3/2011 | Bronczyk et al. | 327/332 |
| 2015/0008349 | A1 * | 1/2015 | Jackson | 251/129.11 |
| 2015/0090039 | A1 * | 4/2015 | Broden et al. | 73/706 |

FOREIGN PATENT DOCUMENTS

| | | |
|---|---|---|
| EP | 0 174 748 | 8/1985 |
| GB | 1 130 986 | 10/1968 |
| GB | 1 174 982 | 12/1969 |
| JP | S5034426 A | 4/1975 |
| JP | 50-34426 | 11/1975 |
| JP | H02500223 A | 1/1990 |
| WO | 8802528 A1 | 4/1988 |
| WO | WO 88/02528 | 4/1988 |
| WO | 9802528 A1 | 1/1998 |
| WO | WO 00/21196 | 4/2000 |

OTHER PUBLICATIONS

Office Action from Chinese Patent Application No. 201410324708.2, dated Sep. 5, 2016.
Communication pursuant to Rules 161(1) and 162 EPC in corresponding European Patent Application No. 14777981.3 dated Jul. 26, 2016.
Office Action from Chinese Patent Application No. 201410324708.2, dated May 24, 2017.
Office Action from Japanese Patent Application No. 2016-542767, dated May 9, 2017.
Second Office Action from European Patent Application No. 2016-542767, dated Aug. 29, 2017, 5 pages.
Office Action from Chinese Patent Application No. 201410324708.2, dated Dec. 11, 2017.
Second Office Action from Japanese Patent Application No. 2016-542767, dated Aug. 29, 2017, 5 pages.
Office Action from Chinese Patent Application No. 201410324708.2, dated Jan. 24, 2019.
Communication from European Patent Application No. 14777981.3, dated Jul. 17, 2019.
Reexamination Notification from Chinese Patent Application No. 201410324708.2, dated Jan. 19, 2020.
Reexamination Notification from Chinese Patent Application No. 201410324708.2, dated Jun. 5, 2020 and partial translation.
Summons to Attend Oral Proceedings Pursuant to Rule 115(1) EPC from European Patent Application No. 14777981.3, dated Nov. 18, 2020.

* cited by examiner ental processes. More specifically, the invention relates

ANALOG PROCESS VARIABLE TRANSMITTER WITH ELECTRONIC CALIBRATION

BACKGROUND

The present invention relates to analog process variable transmitters of the type used in control and monitoring of industrial processes. More specifically, the invention relates to calibration of such analog transmitters.

Two-wire transmitters find widespread use in industrial process control systems. A two-wire transmitter includes a pair of terminals which are connected in a current loop together with a power source and a load. The two-wire transmitter may be powered by the loop current flowing through the current loop, and varies the magnitude of the loop current as a function of a parameter or condition which is sensed. In general, the transmitters comprise energized electrical circuits which are enclosed in a sealed housing such that ignition of any combustible atmosphere by faults or sparks from the energized circuit is contained in the housing.

Although a variety of operating ranges are possible, one widely used two-wire transmitter output varies from 4 to 20 milliamperes (mA) as a function of a sensed process variable. It is typical with a two-wire transmitter to provide adjustment of the transmitter output so that a minimum or zero value of the parameter sensed corresponds to the minimum output (for example, a loop current of 4 milliamperes) and that the maximum parameter value to be sensed corresponds to the maximum output (for example, 20 milliamperes). This is referred to as zero and span adjustment.

The minimum and maximum parameter values will vary from one industrial process installation to another. It is desirable, therefore, to provide some means for setting (calibration) the maximum and minimum output levels in the field. In transmitters implemented using analog circuitry this is done typically with electrically energized zero and span potentiometers sealed in the housing. With some transmitters, a housing cover must be removed to gain access to the potentiometers. This exposes the atmosphere surrounding the transmitter to the live circuits in the transmitter. A variety of techniques, however, are available for adjusting the potentiometers while sealing potentially explosive atmospheres surrounding the transmitter from the electrically live circuits in the transmitter. In some transmitters, a rotary adjustment shaft for adjusting a potentiometer is closely fitted through a bore in the housing to provide a long flame path for quenching ignition in the housing before it reaches the atmosphere surrounding the housing. In yet another arrangement, the potentiometers are mechanically coupled to a relatively large bar magnet which is then rotated magnetically by another bar magnet outside the live circuit's enclosure. This arrangement with bar magnets can have the disadvantage of mechanical hysteresis, making precise span and zero setting difficult. Actuated switches are also used for setting span and zero in transmitters, such switches require an opening through the wall of the transmitter's housing to provide for mechanical coupling to the switch.

Thus, it is often difficult to adjust the zero and span potentiometers which are sealed within the transmitter housing. Potential leak paths must be sealed and this may be particularly problematic in a process variable transmitter which must operate in a submersible nuclear environment. The configurations also add constraints to the design, packaging and size of the process variable transmitter.

SUMMARY

A process variable transmitter for measuring a process variable includes a process variable sensor configured to sense a process variable and provide a sensor output. Measurement circuitry receives the sensor output and provides a measured output related to the process variable. Output circuitry provides a device output on a two-wire process control loop based upon the measured output. The output circuitry has a transfer function that is a function of an adjustable analog circuit component. A motorized actuator is configured to adjust the adjustable analog circuit component to thereby change the transfer function of the output circuitry. An optional calibration controller is also provided.

DETAILED DESCRIPTION OF ILLUSTRATIVE EMBODIMENTS

There are many instances in which a process variable transmitter must be implemented using analog circuitry. One of the disadvantages of process various transmitters which are implemented in analog circuitry is that they may need to be calibrated manually using an adjustable analog circuit component such as span and zero variable resistors ("pots" or potentiometers). In some prior art configurations, these potentiometers are accessed using screws which are exposed through an electronics housing of the transmitter. This adds additional design restrictions to the transmitter configuration in terms of size, location of electronics and potential leak paths through the housing.

In one illustrative example of the invention, an analog process variable transmitter is implemented using an adjustable analog circuit component which is not required to be accessed through openings in the transmitter housing. In a specific example, electrically controlled calibration techniques are used to adjust potentiometers from within the transmitter housing. For example, an internal motor can be used to adjust a potentiometer. Such a configuration also allows the calibration of the process variable transmitter to be performed remotely and/or using calibration software. Further, such electronically controlled calibration reduces design constraints and allows the implementation of architecture capable of completely enclosing all of the electronics in a welded, compact enclosure. This also allows for optimization of electrical component reliability and improves the robustness of the transmitter to vibration and seismic activity.

Figure 1:
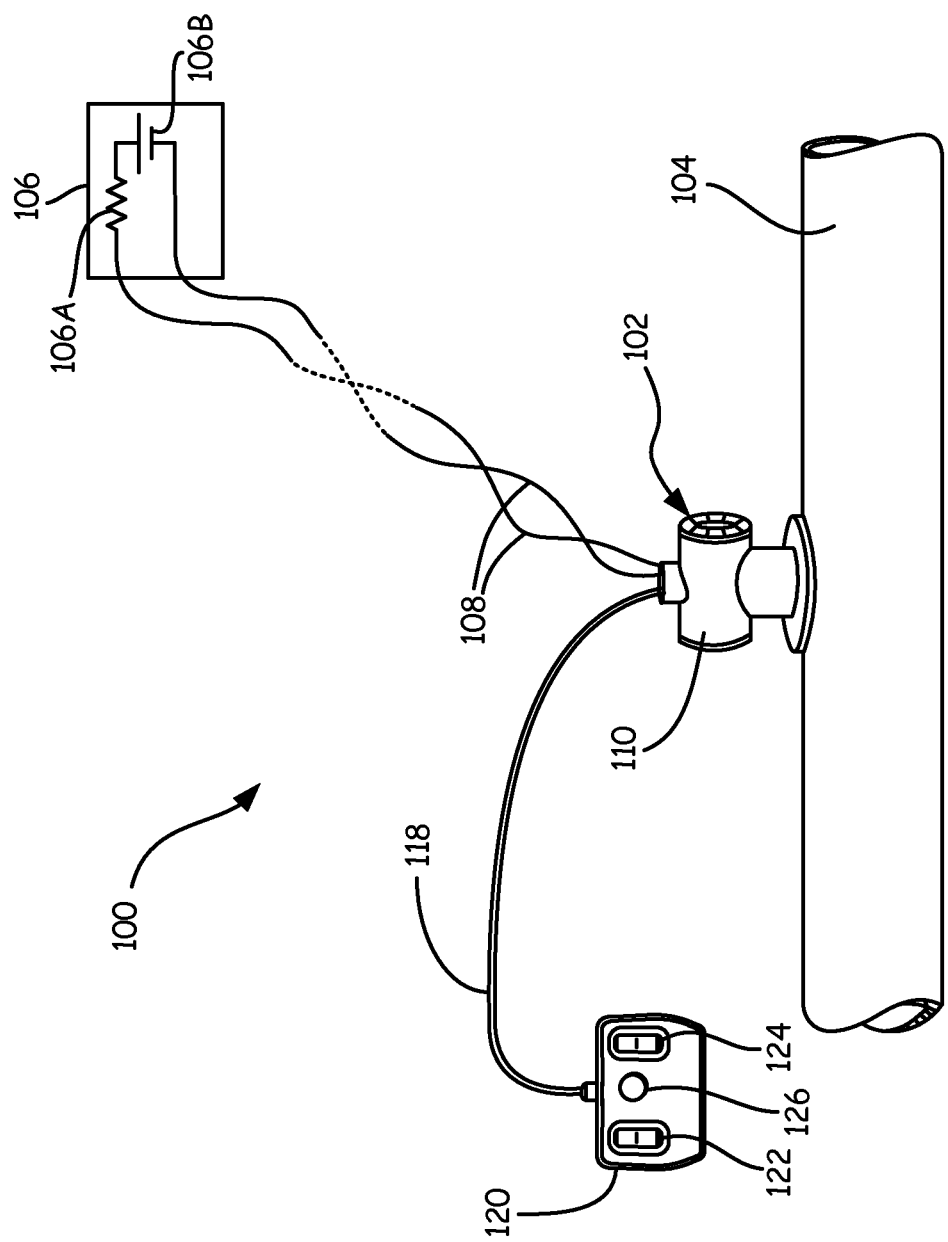
FIG. 1 is a simplified diagram showing an example of a system for monitoring or controlling an industrial process.

FIG. 1 is a simplified example diagram showing an industrial process controller monitoring installation 100 in which a process variable transmitter 102 is coupled to process piping 104. Process variable transmitter 102 includes a process variable sensor (not shown in FIG. 1) which is used to sense a process variable of process fluid in process piping 104. Example process variables include pressure, temperature, flow rate, turbidity, level, pH, etc.

Based upon the sensed process variable, the process variable transmitter 102 communicates with a remote location such as a central control room 106 over a two-wire process control loop 108. Control room 106 is illustrated in a simplified manner as a resistance 106A and a power source 106B. Two-wire process control loop 108 is configured to provide power to process variable transmitter 102 as well as carry communication from process variable transmitter 102. (However, power may also be delivered by other means). In one example embodiment, a current level on the process control loop 108 is representative of the sensed process variable. For example, a 4-20 mA current loop can be implemented in which a 4 mA current level indicates a zero reading and a 20 mA current level indicates a full scale reading. In order to accurately interpret the current level, the "zero" and "span" of the output current must be set through a calibration procedure. The zero setting corresponds to the process variable reading which will result in a 4 mA output and the span setting relates to the maximum range of the sensed process variable whereby a maximum sensed process variable value will result in a 20 mA current level on the process control loop 108. As discussed in the Background section, such zero and span settings in an analog type process variable transmitter may be adjusted using openings through a housing 110 of the process variable transmitter 102.

FIG. 1 also illustrates one embodiment of a calibration controller 120 coupled to the process variable transmitter 102 through wiring 118. As explained below in more detail, calibration controller 120 includes a zero adjustment switch 122, a span adjustment switch 124 and a motor speed control 126. Switches 122 and 124 are used to energize motors (not shown in FIG. 1) within transmitter 102 which control, respectively, the zero and span settings of the current output from the transmitter 102. Further, motor speed control 126 is used to adjust the rate of speed at which the internal adjustment motors operate, including a forward or reverse direction. Calibration controller 120 may be temporarily coupled to the process variable transmitter 102 and operated by service personnel, for example, during the installation and commissioning of the transmitter 102. In another illustrative configuration, switches 122 and 124 are three position switches having a forward, off and reverse positions. In such a configuration, the motor speed control 126 does not need to be capable of reversing the direction of the motors.

Figure 2:
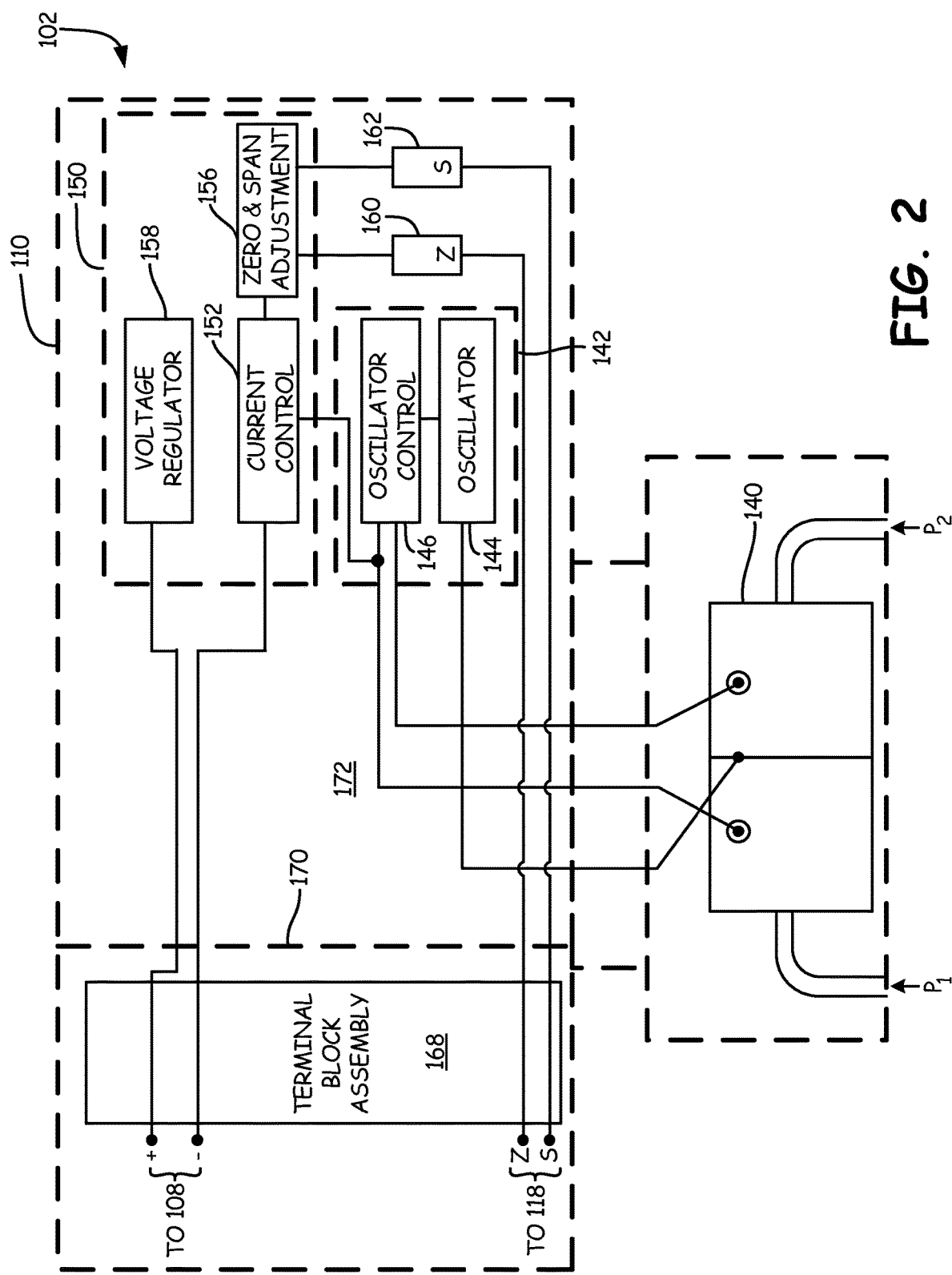
FIG. 2 is a simplified block diagram of an industrial process variable transmitter including electrically controlled actuators used to perform span and zero adjustments in accordance with one example embodiment.

FIG. 2 is a simplified block diagram of the process variable transmitter 102 shown in FIG. 1. Process variable transmitter 102 includes a process variable sensor 140. In the example embodiment of FIG. 2, sensor 140 is configured as a differential pressure sensor configured to sense a pressure difference between applied pressures $P_1$ and $P_2$. Such a differential pressure can be related to, for example, a flow rate of process fluid through process piping 104 shown in FIG. 1. Measurement circuitry 142 includes an oscillator and an oscillator controller 144 and 146 which couple to the process variable sensor 140. In accordance with known techniques, the process variable sensor may include a capacitance which varies in response to the applied pressures $P_1$ and $P_2$. The frequency of the oscillator 144 can be related to the sensed pressure and provided as a measurement circuit output to output circuitry 150. The output circuitry 150 includes current control circuitry 152 which controls a current I flowing through the two-wire process control loop 108 based upon the measurement circuit output. Zero and span adjustment circuitry 156 controls the transfer function of output circuitry 150 and includes adjustable analog circuit components illustrated as potentiometers 190, 192 (shown in FIG. 3) which are operated by respective zero and span actuator motors 160 and 162. Zero and span adjustment circuitry changes the transfer function of output circuitry 150 and controls how the current applied to the process control loop 108 is related to the measurement circuitry output. Although only span and zero are specifically illustrated, any aspect of the transfer function may be adjusted using this technique including, for example, damping of the measured process variable as applied to the current loop 108. A voltage regulator 158 is configured to power the measurement circuitry 142 and the output circuitry 150 using power derived from the process control loop 108.

As illustrated in FIG. 2, housing 110 provides an internal compartment which is divided by an internal bulkhead 170 or the like whereby cavity 172 is isolated from the external process environment. Electrical connections are provided through bulkhead 170 for connecting process control loop 108. Additional zero and span connections are provided for coupling to wiring 118 of calibration controller 120 shown in FIG. 1. A terminal block assembly 168 carries connectors for coupling output circuitry 150 to the process control loop 108 and for electrically connecting the calibration controller 120 to the zero and span actuator motors 160, 162, respectively. These connections can comprise, for example, screw terminals, a plug adapter, etc. This allows the internal motors to be controlled electronically through a hermetically sealed connector interface to the transmitter. Typically, after the zero and span adjustments have been performed, the calibration controller 120 will be disconnected from the process variable transmitter 102 and the terminal block assembly 168.

Figure 3:
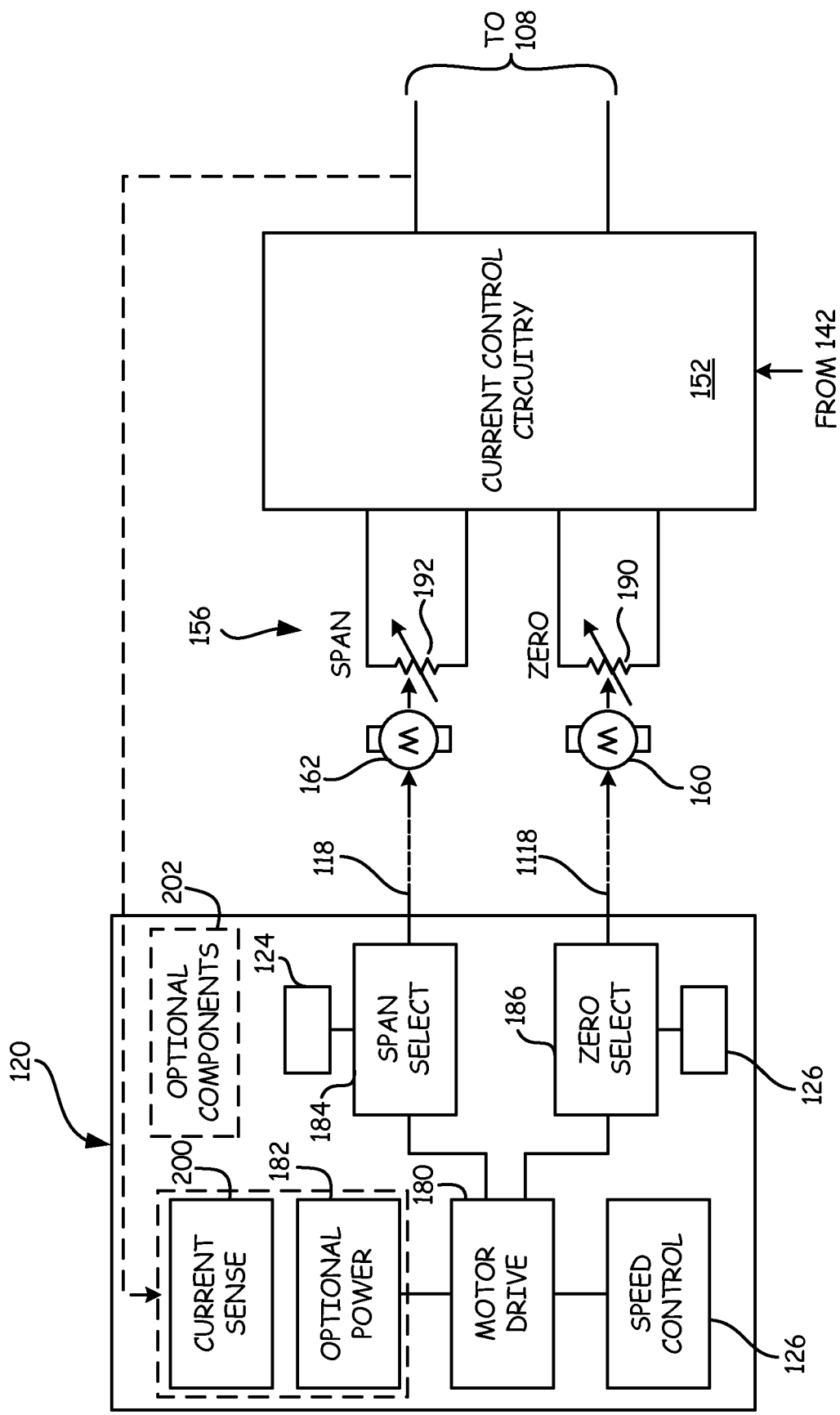
FIG. 3 is a simplified electrical schematic diagram showing the electrically controlled span and zero actuators of FIG. 2 connected to a configuration controller.

FIG. 3 is a simplified block diagram showing calibration controller 120 coupled to motors (motorized actuators) 160 and 162 through wiring 118. Although wiring 118 is illustrated as two individual lines, any number of wires may be used to couple to motorized actuators 160 and 162. As illustrated in FIG. 3, calibration controller 120 includes motor drive circuitry 180 which is powered by an optional power source 182. Motor drive circuitry 180 provides a motor drive output to span select circuitry 184 and zero select circuitry 186. Span and zero select circuitry 184, 186 are selected by an operator using switches 122 and 124, respectively.

During operation, an operator controls calibration controller 120 by selecting a desired speed using speed control 126 and a desired motorized actuator 160, 162 to be actuated using switches 122, 124, respectively. This causes one or both of the motorized actuators 160, 162 to turn and thereby adjust zero and span potentiometers 190, 192, respectively. Typically, potentiometers are adjusted by rotating a shaft coupled to a slideable contact which varies a resistance. However, any potentiometer configuration can be used including linearly actuated potentiometers in which a linear slider is employed. To calibrate the transmitter 102, an operator can monitor the current flowing through loop 108 while potentiometers 190, 192 are adjusted to obtain a desired loop current level. For example, a zero or low flow condition can be applied to the process variable sensor 140 shown in FIG. 2 and the current flowing through loop 108 can be adjusted to a minimum level, for example, 4 mA. A similar adjustment can be performed to adjust the span of the current level such that a maximum process variable measurement will result in a current level of 20 mA on the loop 108.

Actuator motors 160 and 162 may be in accordance with any appropriate technology. The motors may operate based upon an applied AC or DC signal and may also include optional gearing mechanisms for finer control of the potentiometers 190, 192. Internal control or feedback mechanisms can be employed to provide a servomotor configuration for more accurate control. In another specific example, DC gear motors can be implemented with a low RPM rate, for example, between 3 and 5 RPM. Other examples of motorized actuator configurations include a stepper motor type configuration or a rotary solenoid. However, the invention is not limited to these configurations.

FIG. 3 also illustrates optional current sense circuitry 200 in calibration controller 120 coupled to the process control loop 108. This can be, for example, using a shunt connection in which a voltage level is measured across an electrical shunt which carries the loop current. The current sense circuitry 200 may include a display whereby an operator can observe the current level flowing through the process control loop. In another example embodiment, the current sense circuitry 200 includes automatic adjustment circuitry for use in automatically performing the zero and span adjustments. Such a configuration may be implemented, for example, in a microprocessor or the like in the calibration controller 120. These components are illustrated as optional components 202. Such optional components include display circuitry, digital processing circuitry such as a microprocessor, digital to analog or analog to digital conversion circuitry, memory, etc. Further, as some calibration procedures require an extended period to complete, such an automated calibration process may be desirable as it does not require direct operator supervision and control. A configuration which employs software control can also allow more accurate and repeatable calibration. The configuration allows the transmitter to be calibrated remotely using, for example, a handheld device. With sufficiently long wiring 118, the transmitter 102 can be calibrated even when it is located in an inaccessible or otherwise undesirable location such as in a submerged area, high temperature area, radioactive area, elevated area, sump area, etc.

In another example, an optional connection to the process control loop 108 is used to provide power to the circuitry of the calibration controller 120. In such a configuration, the motorized actuators 160, 162 are powered with power received from the process control loop 108.

In another example configuration, calibration controller 120 uses the optional power supply 182 to provide power to the process variable transmitter 102. In such a configuration, power is provided to the terminal block connectors 168 used to couple to the process control loop 108 whereby a local process variable loop is provided by the optional power source 182 and a load resistance which may be contained in source 182. This allows the span and zero of the process variable transmitter 102 to be calibrated without requiring transmitter 102 to be coupled to process control room 106.

By eliminating the zero and span adjustment screws of the prior art, new design configurations of the transmitter 102 are possible. For example, a fully enclosed transmitter 102 can be fabricated which optimizes reliability. Such a configuration is fully submersible and provides the ability to prevent environmental gases from entering the electronics housing thereby improving performance of the transmitter. Such a configuration also reduces the size of the transmitter and allows greater freedom in configuring the internal electronics and other components.

Figure 4:
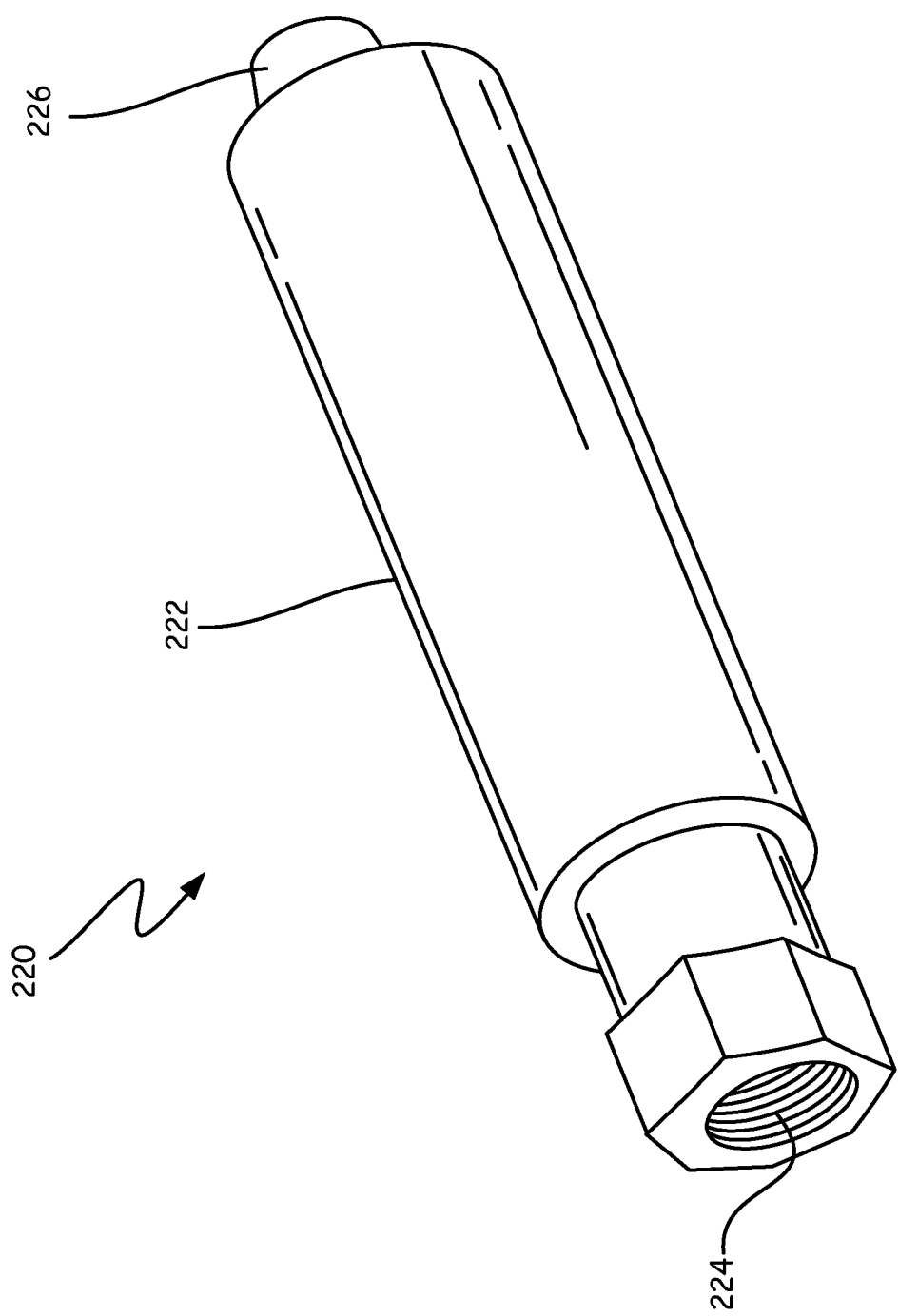
FIG. 4 is a perspective view of another example embodiment of a process variable transmitter.

FIG. 4 shows one example design configuration of a process variable transmitter 220 which may be implemented once the requirement of externally accessible adjustment screws is eliminated. In FIG. 4, a process variable transmitter 220 is fabricated as a signal enclosure in the form of an elongate tube 222. One end of the tube 222 includes a process connection 224 while the other end of the tube 224 includes electrical connector 226. The electrical connector 226 is used for coupling to a process control loop 108 as well as coupling to calibration controller 120.

Although the present invention has been described with reference to preferred embodiments, workers skilled in the art will recognize that changes may be made in form and detail without departing from the spirit and scope of the invention. The potentiometers discussed herein are one example of an adjustable analog circuit component, however, the present invention is not limited to adjustment of potentiometers. The connection 118 between the calibration controller 120 and the field device 102 may include wiring for bi-directional communication. For example, position information related to the position of the motorized actuators 160, 162 and their respective potentiometers 190, 192 may be provided. The connection to the terminal block assembly 168 of the wiring 118 can be, for example, through terminal screw connections, a plug connection, etc. Typically, the connection is of a temporary nature whereby the wiring 118 is disconnected once the calibration procedure is completed. The motors described herein are but one example of a motorized actuators and other configurations may be employed. Although a current level output is described, any type of device output can be provided in which the output circuitry transfer function controls the device output.

What is claimed is:

1. A process variable transmitter system for measuring a process variable, comprising:
    a process variable sensor configured to sense a process variable and provide a sensor output;
    measurement circuitry configured to receive the sensor output and provide a measured output related to the process variable;
    output circuitry configured to provide a device output on a two-wire process control loop based upon the measured output, the output circuitry having a transfer function that is a function of an adjustable zero setting analog circuit component and an adjustable span setting analog circuit component; and
    a motorized zero setting actuator configured to receive a signal received from a calibration controller related to a desired zero setting of the device output and which responsively adjusts the adjustable zero setting analog circuit component to thereby change the transfer function of the output circuitry;
    a motorized span setting actuator configured to receive a signal received from the calibration controller related to a desired span setting of the device output and which responsively adjusts the adjustable span setting analog circuit component to thereby change the transfer function of the output circuitry;
    a transmitter housing and wherein the measurement circuitry, motorized zero setting actuator, motorized span setting actuator and output circuitry are located entirely in a hermetically sealed environment in the transmitter housing and wherein the calibration controller is outside the housing; and the calibration controller configured to send the signals related to the desired zero and span settings to the motorized zero setting actuator and motorized span setting actuator, respectively.

2. The process variable transmitter system of claim 1, wherein at least one of the adjustable zero setting analog circuit component and adjustable span setting analog circuit component comprises a potentiometer.

3. The process variable transmitter system of claim 1, wherein the housing includes a bulkhead and the transmitter output is provided through an electrical connection which extends through the bulkhead.

4. The process variable transmitter system of claim 1, wherein the housing includes a bulkhead and wherein an electrical connection to the motorized actuator extends through the bulkhead.

5. The process variable transmitter system of claim 1, wherein at least one of the zero setting motorized actuator and span setting motorized actuator comprises a DC gear motor.

6. The process variable transmitter system of claim 1 wherein the device output comprises a current level.

7. The process variable transmitter system of claim 1, including a motor drive control.

8. The process variable transmitter system of claim 1, including an optional power source configured to power the process variable transmitter.

9. The process variable transmitter system of claim 1, wherein circuitry of the calibration controller is powered with power received from the two-wire process control loop.

10. The process variable transmitter system of claim 1, including current sense circuitry configured to sense the device output.

11. The process variable transmitter system of claim 10, wherein the motorized actuators are controlled based upon the sensed current.

12. A method of calibrating a process variable transmitter of the type used to measure a process variable, comprising:
    sensing a process variable with a process variable sensor;
    measuring the sensed process variable;
    providing a device output on a two-wire process control loop based upon the measured process variable and a transfer function of output circuitry; and
    changing the transfer function of the output circuitry using a zero setting motorized actuator which receives a signal received from a remote location related to a desired zero setting of the device output and which responsively adjusts an adjustable zero setting analog circuit component of the output circuitry;
    changing the transfer function of the output circuitry using a span setting motorized actuator which receives a signal received from the remote location related to a desired span setting of the device output and which responsively adjusts an adjustable span setting analog circuit component of the output circuitry;
    enclosing the measurement circuitry, motorized zero setting actuator, motorized span setting actuator and the output circuitry entirely in a hermetically sealed housing and wherein the remote location is outside the housing; and
    sending the signals related to the desired zero and span settings to the to the process variable transmitter using a calibration controller.

13. The method of claim 12, wherein at least one of the adjustable zero setting analog circuit component and adjustable span setting analog circuit component comprises a potentiometer.

14. The method of claim 12, wherein changing the transfer function comprises energizing the motorized actuators with a calibration controller.

15. The method of claim 12, including powering the process variable transmitter.

16. The method of claim 12, including sensing the device output.

17. The method of claim 16, including controlling the motorized actuators based upon the sensed output.

18. The method of claim 12 wherein the device output comprises a current level.

* * * * *